United States Patent [19]

Haferl

[11] Patent Number: 4,634,938
[45] Date of Patent: Jan. 6, 1987

[54] LINEARITY CORRECTED DEFLECTION CIRCUIT

[75] Inventor: Peter E. Haferl, Adliswil, Switzerland

[73] Assignee: RCA Corporation, Princeton, N.J.

[21] Appl. No.: 802,019

[22] Filed: Nov. 25, 1985

[30] Foreign Application Priority Data

Dec. 13, 1984 [GB] United Kingdom ............... 8431548
Apr. 17, 1985 [GB] United Kingdom ............... 8509833

[51] Int. Cl.$^4$ ............................................. H01J 29/56
[52] U.S. Cl. ................................................. 315/371
[58] Field of Search ...................... 315/371, 399, 370

[56] References Cited

U.S. PATENT DOCUMENTS 3,428,853  2/1969  Akatsu .
4,281,275  7/1981  Chapman et al. .
4,468,593  8/1984  Haferl .
4,516,058  5/1985  Haferl .

OTHER PUBLICATIONS

Manual: "Solid State Color Television - The RCA CTC-40 Chassis", pp. 75-86, copyright 1968.

Primary Examiner—Theodore M. Blum
Attorney, Agent, or Firm—Eugene M. Whitacre; Paul J. Rasmussen; Joseph J. Laks

[57] ABSTRACT

A linearity correction circuit for correcting asymmetrical linearity errors of the line deflection current includes a resonant capacitor coupled to a first inductor for forming a resonant circuit having a resonant frequency greater than or equal to the deflection retrace frequency. A controllable switch coupled to the resonant circuit and to the deflection trace capacitor becomes conductive at the beginning of retrace to generate an oscillatory current pulse in the resonant circuit that removes a predetermined amount of charge from the trace capacitor during retrace. A second, relatively large valued inductor is coupled to the line deflection winding and is responsive to the deflection retrace pulse voltage for supplying during the trace interval a linearity correction current to the trace capacitor via the resonant capacitor.

8 Claims, 6 Drawing Figures

LINEARITY CORRECTED DEFLECTION CIRCUIT

This invention relates to a linearity corrected deflection circuit.

Line deflection circuits are subject to asymmetrical horzontal linearity errors caused by losses in the horizontal deflection winding and the trace switch. Biased linearity coils or active device linearity correction circuits have been used to provide linearity correction. Such linearity correction arrangements may have various undesirable operating characteristics that may make them less suitable for use in high performance applications such as monitors, color TV receivers with flat-faced picture tubes, such as the RCA Corporation square-planar picture tubes, deflection systems with variable scan widths, or deflection systems which require a large amount of east-west raster correction.

In some types of linearity correction circuits, the amount of linearity correction may not properly follow the variations in deflection current amplitude. Linearity may be degraded when the raster width is changed. East-west raster correction may be adversely affected by the linearity circuit.

In an active linearity correction circuit, the S-shaping or trace capacitor may acquire an additional charge during trace to obtain an increased deflection current during the second half of trace. This additional charge must be taken out of the trace capacitor during retrace to avoid a DC component in the deflection current. Furthermore, a circuit that provides adjustable charge-discharge operation should not produce excessive power dissipation.

In accordance with an aspect of the invention, a linearity corrected deflection circuit includes a deflection winding, a trace capacitance, and a retrace capacitance. A first switch coupled to the deflection winding and operated at a deflection rate applies a trace voltage to the deflection winding to generate a trace deflection current. The retrace capacitance and the deflection winding form a resonant retrace circuit during the retrace interval. A first inductance and a resonant capacitance form a second resonant circuit having a resonant frequency greater than or approximately that of the retrace frequency. A second switch coupled to the second resonant circuit and to the trace capacitance switches conductive states within the retrace interval to generate an oscillatory current pulse in the second resonant circuit that removes a predetermined amount of charge from the trace capacitance. A second inductance coupled to the deflection winding supplies during the trace interval a correction current to the trace capacitance via the resonant capacitance to provide linearity correction.

Figure 1:
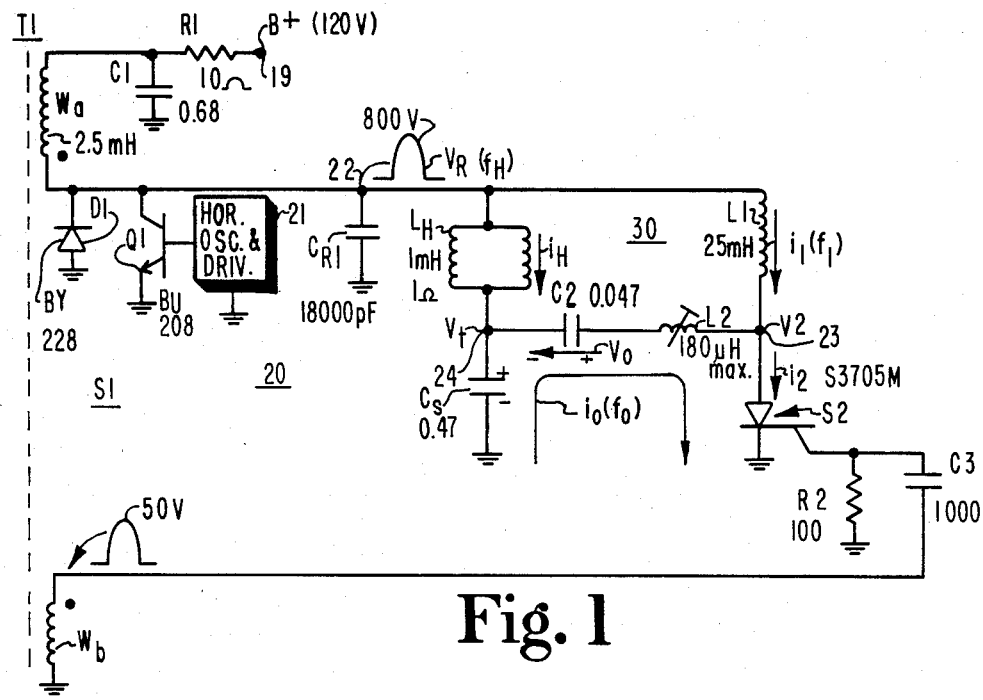
FIG. 1 illustrates a linearity corrected deflection circuit embodying the invention.

In linearity corrected horizontal deflection circuit 20 of FIG. 1, embodying the invention, the series arrangement of a horizontal deflection winding $L_H$ and a grounded S-shaping or trace capacitor $C_s$ is coupled to a trace switch S1 at a terminal 22. Trace switch S1 comprises a horizontal output transistor Q1 and a damper diode D1. A retrace capacitor $C_{R1}$ is coupled to terminal 22, the junction of horizontal deflection winding $L_H$ and trace switch S1.

Horizontal output transistor Q1 is operated at a 15.625 kilohertz line deflection rate, $f_H$, by a horizontal oscillator and driver circuit 21, to generate in line deflection winding $L_H$ a line deflection current $i_H$, illustrated by the solid-line waveform of FIG. 2b. A retrace pulse voltage $V_R$ illustrated in FIG. 2a, is developed at terminal 22 during the horizontal retrace interval t1–t4.

To replenish resistive losses incurred in deflection circuit 20, energy is supplied to the deflection circuit from a B+ voltage terminal 19 via a small valued resistor R1 and the primary winding $W_a$ of a flyback transformer T1. A filter capacitor C1 is coupled to the upper terminal of primary winding $W_a$.

Figure 2:
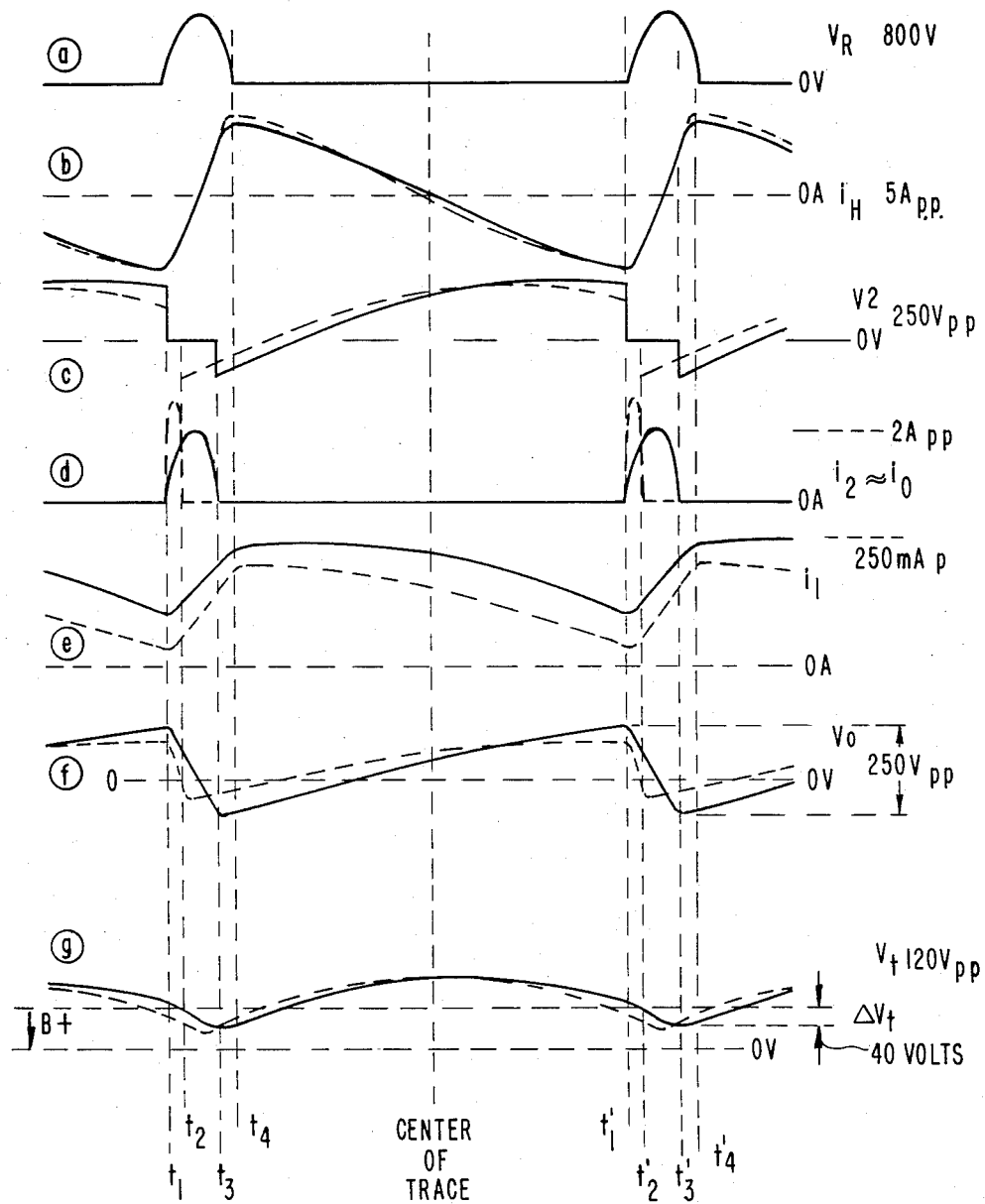
FIG. 2 illustrates waveforms associated with the operation of the circuit of FIG. 1.

During the line trace interval, between time t4 and time t1' of FIG. 2, trace switch S1 is closed, enabling trace capacitor $C_s$ and deflection winding $L_H$ to form a trace resonant circuit ($L_H$, $C_s$) that applies across deflection winding $L_H$ the trace voltage $V_t$ developed by trace capacitor $C_s$ at terminal 24. The resonant frequency of trace resonant circuit ($L_H$, $C_s$) is slightly lower than half the deflection frequency, or approximately 7.3 kilohertz for the circuit values shown in FIG. 1. As illustrated by the solid-line waveform of FIG. 2b, trace resonant circuit ($L_H$, $C_s$) provides symmetrical S-shaping of line deflection current $i_H$.

Resistive losses in trace switch S1 and line deflection winding $L_H$ tend to introduce asymmetrical linearity distortion to deflection current $i_H$ during the trace interval. The resistive losses tend to flatten the slope of the line deflection current near the end of the trace interval relative to the corresponding slope near the beginning of the trace interval. Additionally, asymmetrical linearity distortion tends to shift the zero-current crossover instant of line deflection current $i_H$ to an earlier instant relative to the center of the line trace interval. The dashed-line waveform of deflection current $i_H$ in FIG. 2b illustrates the asymmetrical linearity distortion described above.

In accordance with an aspect of the invention, horizontal deflection circuit includes a linearity correction circuit 30 that corrects the asymmetrical linearity distortion in horizontal deflection current $i_H$. Linearity correction circuti 30 includes a resonant circuit (L2, C2) coupled to trace capacitor $C_s$ at terminal 24. Resonant circuit (L2, C2) comprises an inductor L2, adjustable in value, and a capacitor C2. The resonant frequency, $f_0$, of resonant circuit (l2, C2) is higher than or approximately equal to the line retrace frequency. For the circuit values shown in FIG. 1, the resonant frequency of resonant circuit (L2, C2) is approximately 55 kilohertz, compared to a line retrace frequency of approximately 44 kilohertz, when inductor L2 is adjusted to exhibit an inductance of 180 microhenry. The inductance of inductor L2 is relatively small compared to the 1 millihenry inductance of deflection winding $L_H$. Linearity correction circuit 30 also includes a relatively large inductor L1 coupled to line deflection winding $L_H$ at terminal 22 and coupled to resonant circuit (L2, C2) at a terminal 23. For the circuit values shown in FIG. 1, the inductance of inductor L1 is approximatly 25 times greater than the inductance of deflection winding $L_H$.

A controllable switch S2 is coupled between terminal 23 and ground. Switch S2 illustratively comprises a thyristor.

During the horizontal retrace interval, t1–t4 of FIG. 2, deflection winding $L_H$ and retrace capacitor $C_{R1}$ form a resonant retrace circuit to develop retrace pulse voltage $V_R$ at terminal 22. Retrace pulse voltage $V_R$ is applied to inductor L1 of linearity correction circuit 30. The retrace pulse voltage developed across winding $W_b$ of flyback transformer T1 is applied to the gate of thyristor switch S2 via a differentiating network comprising a capacitor C3 and a resistor R2 to turn the thyristor on at the beginning of retrace, at time t1 of FIG. 2.

When thyristor S2 becomes conductive at the beginning of retrace, terminal 23 is grounded, as illustrated by the solid-line waveform of voltage V2 of FIG. 2c. At the beginning of retrace, current $i_1$ in inductor L1 begins to ramp upwardly under the influence of applied retrace pulse voltage $V_R$, as illustrated by the solid-line waveform of FIG. 2e. Current $i_1$ flows from terminal 22 to ground via thyristor S2.

The voltage $V_0$ across resonant capacitor C2 is positive at the beginning of retrace, as illustrated by the solid-line waveform of FIG. 2f. Resonant circuit (L2, C2) undergoes one-half cycle of oscillation to generate a positive resonant current pulse $i_0$ that flows in the resonant circuit via thyristor S2 and trace capacitor $C_s$. Resonant capacitor C2 is substantially smaller than trace capacitor $C_s$, illustratively one-tenth the capacitance of capicitor $C_s$ for the circuit values of FIG. 1. The duration of the resonant oscillation of current $i_0$ is therefore essentially determined by the resonant frequency $f_0$ of resonant circuit (L2, C2).

Resonant current $i_0$ generates within retrace a current pulse $i_2$ in thyristor S2 between times t1–t3, as illustrated by the solid-line waveform of FIG. 2d. Current pulse $i_2$ equals the sum of current $i_0$ and the relatively low amplitude current $i_1$ in inductor L1. Near time t3, current $i_2$ is substantially zero, with resonant current $i_0$ having undergone slightly more than one-half cycle oscillation to provide a cancellation in thyristor S2 of the inductor current $1_1$. Switch S2, therefore, advantageously becomes nonconductive at substantially zero current level, with low dissipation, near time t3 of FIG. 2d.

Disregarding the value of inductor L2 relative to the much larger valued inductor L1, terminal 23 remains a ground point AC-wise at the retrace frequency after thyristor S2 turns off at time t3 of FIG. 2. Terminal 23 represents an AC ground because at the retrace frequency, capacitor C2 and trace capacitor $C_s$ are of very low impedance compared to the impedance of inductor L1. Current $i_1$ in inductor L1 therefore continues to ramp upwardly during the remainder of the retrace interval, between times t3 and t4, under the influence of retrace pulse voltage $V_R$, as illustrated by the solid-line waveform of FIG. 2e.

The one-half cycle of current oscillation of resonant circuit (L2, C2) reverses the polarity of the voltage $V_0$ developed across capacitor C2 from a positive voltage at the beginning of retrace, at time t1, to a negative voltage at the end of the current oscillation at time t3, as illustrated by the solid-line waveform of FIG. 2f. Capacitor C2 begins to recharge at time t3 by the inductor current $i_1$, as illustrated in FIG. 2f by the solid-line, upwardly ramping voltage $V_0$ between times t3 and t4.

At the beginning of the line trace interval, at time t4, damper diode D1 of trace switch S1 becomes conductive, grounding terminal 22. Inductor current $i_1$ continues to recharge capacitor C2 during the line trace interval t4–t1' via the current path through trace capacitor $C_s$. Inductor L1 and capacitor C2 form another resonant circuit (l1, C2) during the trace interval having a resonant frequency $f_1$ that is substantially lower than the deflection trace resonant circuit ($L_H$, $C_s$). For the circuit values shown in FIG. 1, the resonant frequency $f_1$ is approximately 4.6 kilohertz. The current $i_1$ provided by inductor L1 is waveshaped during the line trace interval by the resonant circuit (L1, C2), as illustrated by the solid-line waveform of FIG. 2e between times t4 and t1'.

Current $i_1$ serves as a linearity correction current during the line trace interval by supplying an additional charge to trace capacitor $C_s$, via capacitor C2, that modified the trace voltage $V_t$ applied across line deflection winding $L_H$. The amount or degree of linearity correction is determined in accordance with the average level of correction current $i_1$. A higher level correction current $i_1$ produces more linearity correction to deflection current $i_H$; a lower level produces less linearity correction.

To control the amount of linearity correction, the average value of correction current $i_1$ in inductor L1 is controlled in accordance with the resonant discharge of capacitors C2 and $C_s$ produced by oscillatory current $i_0$ during retrace. A greater discharge of capacitors C2 and $C_s$ by oscillatory current $i_0$ results in a larger average value to correction current $i_1$.

The retrace voltage $V_R$ across retrace capacitor $C_{R1}$ powers linearity correction circuit 30. The di/dt of the upramping current $i_1$ of FIG. 2e during the interval t1–t4 is substantially independent of the conduction time of switch S2, since the di/dt depends upon the applied retrace voltage $V_R$. Thus, a higher amplitude of current $i_1$ at time t1 results in a higher amplitude at time t4 and in a higher average value of current $i_1$.

The amplitude of current $i_1$ at time t1 is controlled by the conduction time of switch S2 by adjustment of the resonant discharge loop current $i_0$ via variable inductor L2, as illustrated in waveform FIGS. 2c and 2d. A longer conduction time of switch S2 during the retrace interval results in two effects. First, the resonant charging of capacitors C2 and $C_S$ starts later, and second, voltage V2 of FIG. 2c remains negative for a longer time between time t4 and the center of trace.

Current $i_1$ increases by both effects as illustrated in FIG. 2e. The first effect increases current $i_1$ at time t1 because of the later starting time of the resonant charging. The charging interval is thereby shortened, and current $i_1$ slopes down less at time t1. The second effect decreases the downramping slope of current $i_1$ during the time voltage V2 is negative, resulting in a further increase of current $i_1$ at time t1.

Current $i_1$ charges the series connected capacitors C2 and $C_S$ during the trace interval. The waveforms of FIGS. 2g and 2f illustrate the voltage $V_t$ across capacitor $C_S$ and voltage $V_0$ across capacitor C2, respectively. Neglecting the small-valued inductor L2, voltage V2 of FIG. 2c illustrates the sum of voltages $V_t$ and $V_0$. In particular, voltage V2 is indicative of the charge provided by current $i_1$ in the series connected capacitors $C_S$ and C2. A higher current $i_1$ provides a greater charge in capacitors $C_s$ and C2 resulting in a higher voltage V2 at times t1 and t1'.

The added charge provided by current $i_1$ during trace is removed during retrace by resonant discharge loop current $i_0$. FIG. 2d illustrates the current $i_2$ in switch S2, which is indicative of the discharge current pulse $i_0$. The resonance mode discharge causes voltages V2 and $V_0$ to change polarity.

Voltage $V_t$ across the much larger capacitor $C_s$ is lowered by the discharge operation as indicated in FIG. 2g. The solid-line waveform illustrates a linearity adjustment that provides a large amount of linearity correction Voltage $\Delta V_t$ indicates the removed charge from capacitor $C_S$ during retrace. During trace the same charge is added by current $i_1$ to provide linearity correction.

The dashed-line waveform of FIG. 2g illustrates an adjustment that provides a low amount of linearity adjustment. Voltage $V_t$ is substantially the same at time t1 and t4, and $\Delta V_t$ is zero. An average linearity adjustment results in a $\Delta V_t$ of approximately 20 volts. Without any linearity correction, voltage $V_t$ is slightly higher at time t4 than at time t1 because of the energy added via winding $W_a$ and retrace capacitor $C_{R1}$.

To adjust the amount of linearity correction provided by linearity correction circuit 30, inductor L2 is adjusted to vary the resonant frequency $f_0$ of resonant circuit (L2, C2), thereby adjusting the duration of oscillatory current pulse $i_0$ and the amount of charge removed from capacitor $C_s$. For example, to provide a lesser amount of linearity correction, inductor L2 is adjusted to be smaller in value, thereby increasing resonant frequency $f_0$ of resonant circuit (L2, C2). Oscillatory current $i_0$ undergoes its half cycle of oscillation within a much smaller interval during retrace, as indicated from FIG. 2d by the dashed-line waveform of current pulse $i_2$.

Dashed-line current pulse $i_2$ has a much shorter duration, interval t1–t2, than the duration, interval t1–t3, of the solid-line current pulse. Although the amplitude of dashed-line current pulse $i_2$ is greater than the amplitude of the solid-line current pulse, the much shorter duration of the dashed-line current pulse results in average value being lower than the average value of the solid-line current pulse. Thus, when resonant circuit (L2, C2) is adjusted for high resonant frequency oscillation, the amount of charge removed by capacitor $C_s$ during retrace is less, and a smallert linearity correction current $i_1$ flows during the trace interval. The smaller linearity correction current provides correspondingly less linearity correction to horizontal deflection current $i_H$, as illustrated by the dashed-line waveform in FIG. 2b.

When resonant circuit (L2, C2) is tuned by adjusting inductor L2, the conduction time of switch S2 varies. Consequently, capacitor C2 starts to recharge at different instants during retrace, which in turn varies the amplitude of correction current $i_1$ during the subsequent trace interval.

At time t4, the beginning of trace, the sum of deflection current $i_H$ and current $i_1$ in inductor L1 is held constant because retrace pulse voltage $V_R$ is maintained constant in amplitude in accordance with the B+ voltage developed at terminal 19. The amplitude of deflection current $i_H$ at the beginning of trace is, therefore, of lower value, varying in a sense opposite that of the amplitude of current $i_1$.

Trace capacitor $C_s$ is charged more slowly by deflection current $i_H$ during the first part of the trace interval. This results in the zero-current crossover instant of deflection current $i_H$ being delayed to a later instant that corresponds with the center of the trace interval, as required for proper linearity correction. Correction current $i_1$ in inductor L1 passes through capacitor C2 and adds an additional charge to trace capacitor $C_s$, causing an increased deflection current $i_H$ during the second half of trace.

During retrace, the additional charge is taken out of trace capacitor $C_s$ by the resonant oscillation of resonant circuit (L2, C2), thereby avoiding a DC component in the deflection current. The resonant oscillation during retrace also reverses the polarity of voltage $V_0$ across capacitor C2 to enable correction current $i_1$ to again charge capacitor C2 during the subsequent trace interval.

The charged removed from capacitor $C_s$ during retrace by current pulse $i_0$ lowers the trace voltage $V_t$ at the beginning of trace. The slope of deflection current $i_H$ is thereby made less steep at the beginning of trace. Correction current $i_1$ adds charge to capacitor $C_s$ during the trace interval, increasing trace voltage $V_t$. During the second half of trace, the slope of deflection current $i_H$ becomes more steep to counteract the effects of the resistive losses on the deflection current slope.

The solid-line waveforms of FIGS. 2b–2f illustrate a situation where inductor L2 is adjusted to produce a somewhat higher than average amount of linearity correction. The corresponding dashed-line waveforms illustrate a situation where inductor L2 is adjusted to tune resonant circuit (L2, C2) to a higher resonant frequency. A smaller amount of linearity correction is thereby provided.

As just described, linearity correction circuit 30, embodying the invention, incorporates an active device switching arrangement that provides for switching during the horizontal retrace interval, leaving correction current $i_1$ and resonant circuit (L1, C2) undisturbed by switching transients throughout the trace interval. The switching arrangement produces no DC component to the deflection current, eliminating the need for a compensating centering circuit. No adjustable DC power source is required for providing the linearity adjustment capability, thereby avoiding excessive power source dissipation.

Due to the polarity reversal of voltage $V_0$ across resonant capacitor C2 during retrace, a large range of linearity correction is made possible at a relatively low power consumption. Additionally, raster width does not significantly change throughout the range of linearity adjustment—a substantial advantage over an adjustable, biased linearity coil.

Figure 3:
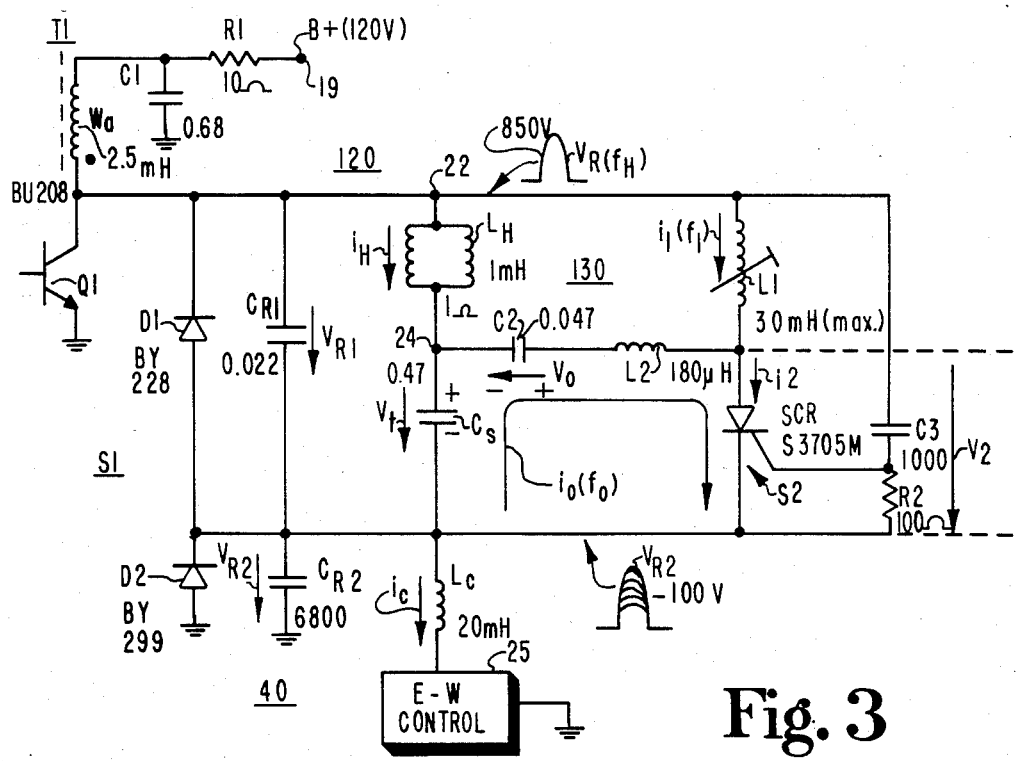
FIG. 3 illustrates another linearity corected deflection circuit.

FIG. 3 illustrates a line deflection circuit 120 that includes a linearity correction circuit 130, embodying the invention. Items in FIGS. 1 and 3 that are similarly identified represent similar quantities or similarly functioning elements. In FIG. 3, an active east-west correction circuit 40 is coupled to horizontal deflection winding $L_H$ via a choke $L_c$. Trace capacitor $C_s$ and retrace capacitor $C_{r1}$ are not directly connected to ground but float above ground potential due to their coupling to the junction of a second retrace capacitor $C_{R2}$ and a second damper diode D2. An east-west control circuit 25 generates a pincushion correction current $i_c$ in choke $L_c$ that modulates at a field rate in a parabolic manner the amplitude of retrace pulse voltage $V_{R2}$ developed across retrace capacitor $C_{R2}$. The amplitudes of deflection current $i_H$ and of retrace pulse voltage $V_{R1}$ are correspondingly modulated. The amplitude of retrace pulse voltage $V_R$ at terminal 22, illustrated in FIGS. 2 and 4a, remains unmodulated. Pincushion correction circuit 40 is further described in British Patent Application No.

2150796A, published 3 July 1985, entitled "East-West Correction Circuit". Other pincushion correction circuits, such as switched mode diode modulator circuits, may be substituted for the pincushion correction circuit of FIG. 3.

It should be noted that linearity correction current $i_1$ is modulated by the operation of east-west correction circuit 40. This modulation advantageously produces a symmetric east-west correction and a straight vertical center-line.

Retrace pulse voltage $V_{R1}$ is differentiated by a capacitor C3 and a resistor R2 and applied to the gate of thyristor S2 to turn the thyristor on at the beginning of horizontal retrace, thereby initiating the resonant oscillation of current $i_0$ that removes charge from trace capacitor $C_s$ during the retrace interval. As in FIG. 1, the amount of linearity correction provided is adjusted by adjusting the average current of oscillatory pulse $i_0$ and the total amount of charge removed from trace capacitor $C_s$ during retrace, thereby adjusting the average value of correction current $i_1$ during the trace interval. However, unlike linearity correction circuit 30 of FIG. 1, linearity correction circuit 130 of FIG. 3 adjusts the average value of correction current $i_1$ by adjusting the inductance of inductor L1 while maintaining the resonant frequency $f_0$ of resonant circuit (L2, C2) unchanged.

Figure 4:
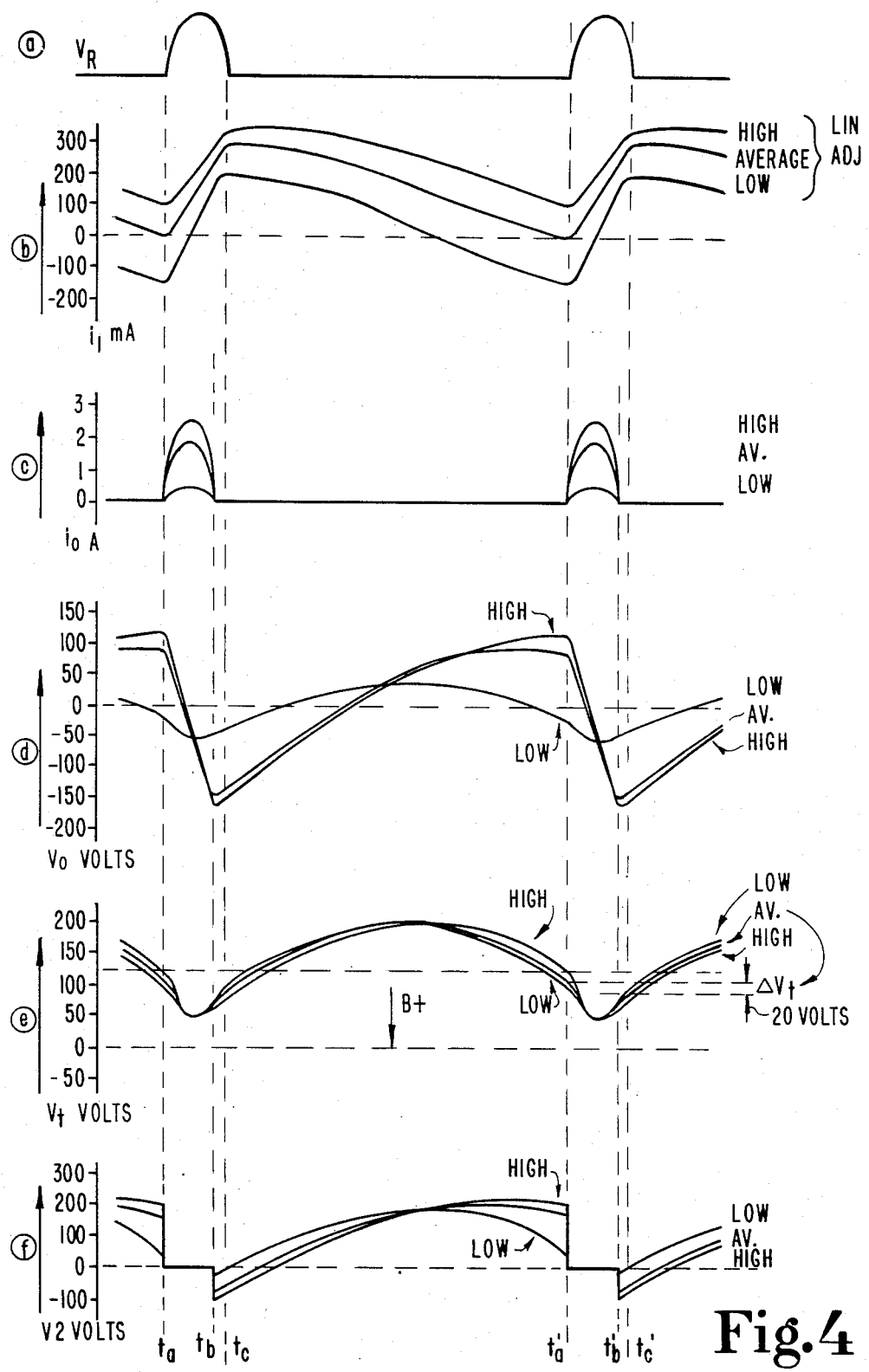
FIG. 4 illustrates waveforms associated with the operation of the circuit of FIG. 3.

Adjusting the inductance of inductor L1, adjusts the resonant frequency $F_1$ of resonant circuit (L2, C2) that is formed by inductor L1 and capacitor C2 during the trace interval. By adjusting the resonant frequency $f_1$, the slope of linearity correction current $i_1$ in inductor L1 varies, resulting in a variable average amount of current $i_1$. Variable current $i_1$ charges series connected capacitors $C_s$ and C2, resulting in variable voltages $V_0$, $V_t$ and V2 at time $t_a$ of FIG. 4. A higher voltage V2 at time $t_a$ results in more charge removed from capacitors $C_s$ and C2 during the interval $t_a$–$t_b$. The greater removed charge causes also that voltage V2 remains negative for a longer time before the center of trace. This results in a further increase of the average current $i_1$, because current $i_1$ starts ramping down at a later instant. The above operation is illustrated in waveform FIGS. 4b–4f. In contrast to FIG. 2d, the di/dt of current $i_1$ of FIG. 4b is no longer constant during the interval $t_a$–$t_c$, for different linearity adjustments, because inductor L1 is now adjustable.

Establishing a lower resonant frequency for resonant circuit (L1, C2) by means of increasing the inductivity of inductor L1, results in a higher average current $i_1$, and in more linearity correction.

The amplitude of the half-cycle of oscillation of resonant current $i_0$ at the beginning of retrace, that removes charge from trace capacitor $C_s$, is determined by the amplitude of voltage $V_0$ at the end of trace. Thus, for a high amount of linearity correction, corresponding to a greater voltage being developed across capacitor C2, the resonant oscillation, as represented in FIG. 4c by the current pulse $i_2$ in thyristor S2, is of larger amplitude. Although the duration of current oscillation during retrace is a fixed interval for both high and low amount of linearity correction, the average value of the current oscillation is larger when providing a higher amount of linearity correction.

By adjusting the inductance of inductor L1 to control the amount of linearity correction produced, linearity correction circuit 130 of FIG. 3 exhibits an increased range of linearity adjustment relative to linearity correction circuit 30 of FIG. 1. Linearity correction circuit 130 also produces lower dissipation in thyristor S2 because the conduction time of the thyristor is not varied. Because linearity correction current $i_1$ in FIG. 3 can be made negative during the second half of trace, differential adjustment of average current $i_{1,}$ is made possible. Only a small variation of the resonance frequency of resonant circuit (L1,C2) results in a large change of average current $i_1$, and in a wide range of linearity adjustment. The positive and negative portions of current $i_1$ are integrated by capacitor $C_S$. The advantage of differential adjustment is that a few turns of the core of adjustable inductor L1 covers a wide range of linearity adjustment.

The following criteria are provided as a guide in selecting the values of various circuit components in FIG. 3. The resonant frequency $f_0$ of resonant circuit (L2, C2) is approximately 20% higher than the deflection retrace frequency. The resonant frequency $f_1$ of resonant circuit (L1, C2) is approximately one-half the resonant frequency of deflection trace resonant circuit ($L_H$, $C_s$). The inductance of inductor L2 may be neglected in the calculation of resonant frequency $f_1$.

When trace capacitor $C_s$ provides symmetrical S-shaping of line deflection current $i_H$ in conjunction with raster scanning on the screen of a large screen, wide angle picture tube, such as a 27 V, 110 degree square-planar picture tube, the value of capacitor C2 is empirically determined to be approximately one-tenth that of capacitor $C_s$. The value of capacitor C2 in conjunction with the adjustment point of inductor L1 establishes the average amount of linearity correction, which in turn depends upon deflection losses.

It should be pointed out that the value of capacitor $C_S$ is related to the value of deflection winding $L_H$ and to the deflection angle. The amplitude of deflection current $i_H$ is related to the amplitude of retrace voltage $V_R$. If capacitor $C_s$, then the value of inductor L1 becomes empirically related to that of deflection winding $L_H$ because of the previously stated selection criteria for resonant frequency $f_1$. The value of inductor L1 is also related to the deflection current amplitude via the relationship of the deflection current to the retrace pulse voltage.

A smaller capacitor C2 requires an inductor L1 of greater inductivity. The resulting higher voltage $V_0$ reduces the average current $i_1$, and insufficient linearity correction may result. Vice-versa, a larger capacitor C2 required an inductor L1 of lesser inductivity. Current $i_1$ may then become excessively high, and excessive linearity correction may result.

The one-tenth selection criteria for 1$f_H$ deflection frequency operation becomes a one-twentieth selection criteria for 2$f_H$ deflection frequency operation because the charge added to capacitor $C_s$ during trace and removed during retrace is about the same in the two cases (charge=current×time).

Figure 5:
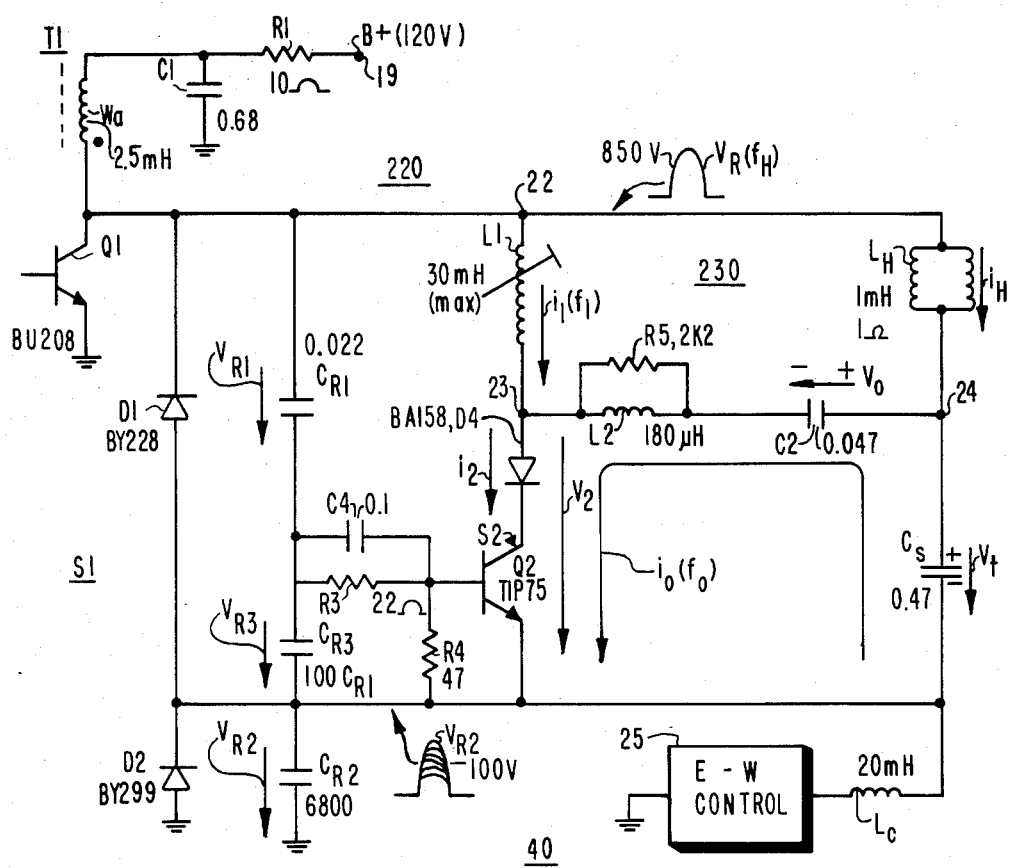
FIG. 5 illustrates a third linearity corrected deflection circuit embodying the invention.

FIG. 5 illustrates a linearity corrected line deflection circuit 220 that includes a linearity correction circuit 230, embodying the invention, wherein a bipolar transistor switch Q2 replaces the thyristor in controllable switch S2. A diode D3 in the collector current path of transistor Q2 prevents negative collector current from flowing. The operation of linearity correction circuit 230 of FIG. 5 is substantially the same as the operation of linearity correction circuit 130 of FIG. 3. Items in FIGS. 3 and 5 similarly identified represent similar quantities or similarly functioning elements.

In FIG. 5, a third retrace capacitor $C_{r3}$ is interposed in series between retrace capacitors $C_{R1}$ and $C_{R2}$. The retrace pulse voltage $V_{R3}$ developed across retrace capacitor $C_{R3}$ is coupled, via a network comprising a capacitor Q2 to turn the transistor on at the beginning of retrace to initiate a half-cycle of resonant current oscillation in resonant circuit (L2, C2). A resistor R5 is coupled across inductor L2 to damp transients developed during the turn-off of switch S2.

Figure 6:
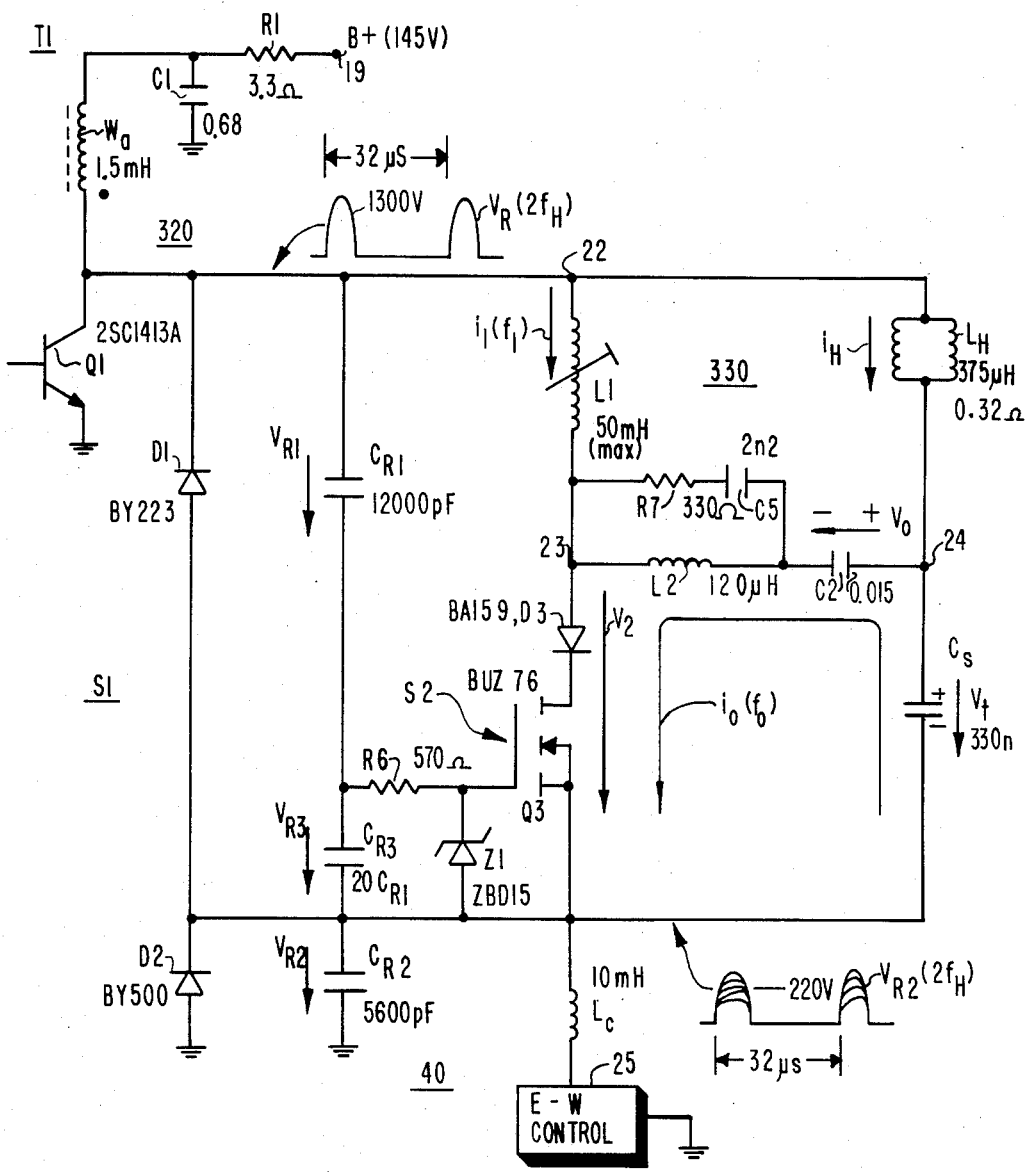
FIG. 6 illustrates a fourth linearity corrected deflection circuit embodying the invention.

FIG. 6 illustrates a linearity corrected line deflection circuit 320 operated at a deflection rate $2f_H$—twice the rate of the deflection circuits of FIGS. 1, 3 and 5. Items in FIGS. 5 and 6 similarly identified represent similar quantities or similarly functioning elements. Linearity correction circuit 330, embodying the invention, is similar to the previously described linearity correction circuits, with the exception that switch S2 comprises an MOS transistor O3 rather than the bipolar transistor of FIG. 5. Additionally, retrace pulse voltage $V_{R3}$ is coupled to the gate of MOS transistor Q3 via a resistor R6. A zener diode Z1 limits the voltage applied to the gate. A damping network is coupled across inductor L2 and comprises a resistor R7 and a capacitor C5.

What is claimed:

1. A linearity corrected deflection circuit comprising:
   a deflection winding;
   a trace capacitance coupled to said deflection winding for developing a trace voltage;
   a retrace capacitance coupled to said deflection winding;
   first switching means coupled to said deflection winding and operated at a deflection rate for applying said trace voltage to said deflection winding during a trace interval of a deflection cycle to generate a trace deflection current in said deflection winding, said retrace capacitance and said deflection winding forming a resonant retrace circuit during a retrace interval of said deflection cycle for developing a retrace pulse voltage and for generating a retrace deflection current in said deflection winding;
   a first inductance;
   a resonant capacitance coupled to said first inductance for forming a second resonant circuit having a resonant frequency about or greater than the retrace frequency of said resonant retrace circuit;
   second switching means coupled to said second resonant circuit and to said trace capacitance and switching conductive states within said retrace interval to generate during said retrace interval an oscillatory current pulse in said second resonant circuit, in accordance with the resonant frequency thereof, for removing a predetermined amount of charge from said trace capacitance; and
   a second inductance coupled to said resonant retrace circuit and having applied thereto said retrace pulse voltage for supplying a correction current to said trace capacitance via said resonant capacitance during said trace interval to provide a predetermined amount of linearity correction to said trace deflection current.

2. A linearity corrected deflection circuit according to claim 1 wherein said oscillatory current pulse undergoes approximately one-half cycle of oscillation during said retrace interval.

3. A linearity corrected deflection circuit according to claim 1 wherein the average value of said correction current is established in accordance with said predetermined amount of charge.

4. A linearity corrected deflection circuit according to claim 1 wherein said deflection winding and said trace capacitance form a resonant trace circuit during said trace interval and wherein said second inductance and said resonant capacitance form a fourth resonant circuit during said trace interval that generates said correction current, said fourth resonant circuit having a resonant frequency lower than the resonant frequency of said resonant trace circuit.

5. A linearity corrected deflection circuit according to claim 4 wherein said second inductance is coupled to said second switching means, said second switching means conducting said oscillatory current pulse during said retrace interval and at the same time bypassing current in said second inductance from said resonant capacitance.

6. A linearity corrected deflection circuit according to claim 5 wherein said second switching means remains in a given conductive state throughout said trace interval to leave said fourth resonant circuit undisturbed by switching transients throughout said trace interval.

7. A linearity corrected deflection circuit according to claim 1 wherein said first inductance is adjustable to adjust the resonant frequency of said second resonant circuit, thereby adjusting the predetermined amount of charge and linearity correction.

8. A linearity corrected deflection circuit according to claim 1 wherein said second inductance is adjustable to concurrently adjust the amplitude of said oscillatory current pulse, thereby adjusting said predetermined amount of linearity correction.

* * * * *

UNITED STATES PATENT AND TRADEMARK OFFICE
CERTIFICATE OF CORRECTION

PATENT NO. : 4,634,938

DATED : 1/6/87

INVENTOR(S) : PETER EDUARD HAFERL

It is certified that error appears in the above-identified patent and that said Letters Patent is hereby corrected as shown below:

Column 1, line 59, that portion reading "corected" should read --corrected--. Column 4, line 5 that portion reading "11" should read --L1--. Column 8, line 38 after "capacitor" and before "$C_s$" insert --C2 is empirically selected one-tenth that of capacitor--. Column 9, line 5 after "capacitor" and before "Q2" insert --C4 and resistors R3 and R4, to the base of transistor--.

Signed and Sealed this

Eighth Day of March, 1988

Attest:

DONALD J. QUIGG

Attesting Officer

Commissioner of Patents and Trademarks